United States Patent

Park

[11] Patent Number: 6,166,667
[45] Date of Patent: Dec. 26, 2000

[54] SELECTION OF TURBO OR NON-TURBO ERROR CORRECTION CODES BASED ON DATA TYPE OR LENGTH

[75] Inventor: Chang-Soo Park, Seoul, Rep. of Korea

[73] Assignee: Samsung Electronics Co., Ltd., Rep. of Korea

[21] Appl. No.: 09/286,557

[22] Filed: Apr. 5, 1999

[30] Foreign Application Priority Data

Apr. 4, 1998 [KR] Rep. of Korea ............ 98-11997

[51] Int. Cl.⁷ .................................. H03M 13/00
[52] U.S. Cl. ....................... 341/94; 714/755; 341/51
[58] Field of Search .................. 341/51, 94; 714/755

[56] References Cited

U.S. PATENT DOCUMENTS

| 5,287,374 | 2/1994 | Parr | 371/43 |
|---|---|---|---|
| 5,434,886 | 7/1995 | Kazawa et al. | 375/262 |
| 5,970,098 | 10/1999 | Herzberg | 375/264 |
| 5,978,414 | 11/1999 | Para | 375/225 |
| 5,997,104 | 11/1999 | Herzberg | 714/755 |
| 6,088,387 | 7/2000 | Gelblum et al. | 375/222 |

FOREIGN PATENT DOCUMENTS

| 7-336364 | 12/1995 | Japan | H04L 12/28 |
|---|---|---|---|
| 10-285147 | 10/1998 | Japan | H04L 1/00 |

*Primary Examiner*—Howard L. Williams
*Attorney, Agent, or Firm*—Dilworth & Barrese, LLP

[57] ABSTRACT

There are provided channel encoding/decoding device and method to efficiently transmit/receive voice and data. Data with a low data rate or a short data frame is convolutionally encoded and data with a high data rate or a long data frame is turbo-encoded, thereby increasing encoding performance.

46 Claims, 5 Drawing Sheets

SELECTION OF TURBO OR NON-TURBO ERROR CORRECTION CODES BASED ON DATA TYPE OR LENGTH

CLAIM OF PRIORITY

This application makes reference to, incorporates the same herein, and claims all benefits accruing under 35 U.S.C. §119 from an application entitled ADAPTIVE CHANNEL ENCODING/DECODING METHOD AND DEVICE earlier filed in the Korean Industrial Property Office on Apr. 4, 1998, and there duly assigned Ser. No. 98-11997.

BACKGROUND OF THE INVENTION

1. Field of the Invention

The present invention relates generally to a channel encoding/decoding device and method in a communications system, and in particular, to a device and method of adaptive channel encoding/decoding to efficiently transmit/receive voice and data.

2. Description of the Related Art

Third-generation digital communication systems offer diverse services and use data frames of a variable size ranging from several bits to several thousands of bits. To encode data in such systems, three types of channel encoders are typically used: Reed-Solomon encoder, convolutional encoder, and Reed Solomon-convolutional concatenated encoder. Since it is very difficult to satisfy the various system requirements including bit error rate (BER) and time delay, an appropriate channel encoder should be selected depending on service type and frame length.

Each of the above channel encoders have their respective advantages and disadvantages as described below:

(1) A disadvantage of the Reed-Solomon encoder is that an outer interleaver is required, resulting in time delay;

(2) Convolutional codes exhibit excellent performance characteristics for a short input frame and a BER of $10^{-3}$ as in voice service but exhibit poor performance for a very low BER as in a data service;

(3) Reed Solomon-Convolutional concatenated codes are used to overcome the shortcoming of the convolutional codes in a data service. These concatenated codes exhibit excellent in performance for data transmission and reception requiring a BER of about $10^{-6}$. Yet, the use of two encoders increases system complexity. In addition, there is an undesirable time delay associated with the Reed-Solomon encoder.

It is well-known in the art that a turbo encoder is attractive for a service with a long data frame and a low BER requirement such as a data service. The turbo encoder is popular due to its well recognized advantages over the concatenated encoder in terms of performance, system complexity, and time delay.

Using two simple parallel concatenated component codes, the turbo encoder generates parity symbols from input of an N-information bit frame. The component codes for the turbo encoder are recursive systematic convolutional (RSC) codes. A well recognized example of a turbo encoder/decoder is disclosed in U.S. Pat. No. 5,446,747 entitled "Error-Correction Coding Method With At Least Two Systematic Convolutional Coding In Parallel, Corresponding Iterative Module and Decoder", by Berrow.

The turbo encoder disclosed in the ('747) patent exhibits improved FEC (forward error correction) performance as an input data frame becomes longer in time. The longer the data frame or the higher data rate, the larger an interleaver of the turbo encoder and the longer a time delay. With input of a short data frame, the turbo encoder cannot exert its full performance. Turbo codes are best suited to applications such as a data service requiring a BER of $10^{-6}$, and conversely, are ill suited to convolutional codes such as a voice service with a 100 or less-bit data frame (i.e., short data frame).

SUMMARY OF THE INVENTION

It is therefore an object of the present invention to provide an encoding device and method in which data is encoded according to an intended service type and/or the number of data defined by length of an input data frame.

Another object of the present invention is to provide an adaptive channel encoding device and method, in which convolutional codes or turbo codes are selected according to service type and data frame size in order to maximize encoding performance.

A further object of the present invention is to provide a simplified channel encoding device and method in which convolutional codes or turbo codes are selectively used.

A still further object of the present invention is to provide an adaptive channel encoding device and method, in which convolutional codes or turbo codes are selected to obtain appropriate BER and time delay according to service type and data characteristics.

Yet another object of the present invention is to provide an adaptive channel decoding device and method, in which encoded channel information is convolutionally decoded or turbo-decoded in response to an information message representing service type and data frame size.

In order to achieve the above objects, there is provided a channel encoding method in a mobile communication system. First the method selects one of two decoding schemes (i.e., convolutional encoding or turbo encoding) according to the service type of data to be transmitted (i.e., voice, character, image), encoding of the data is performed in accordance with the selected coding scheme, and encoded symbols are transmitted on a transmission channel.

According to another aspect, there is provided a channel decoding method in a mobile communication system. A decoding scheme is selected according to the service type of a received encoded data frame, and decoding is performed on the received encoded frame data in accordance with the selected decoding scheme.

BRIEF DESCRIPTION OF THE DRAWINGS

The above objects and advantages of the present invention will become more apparent from the following detailed description of preferred embodiments thereof when considered with reference to the attached drawings, in which.

DETAILED DESCRIPTION OF THE PREFERRED EMBODIMENTS

Preferred embodiments of the present invention will be described in detail with reference to the attached drawings. It is to be noted that a description of known functions and structures will be omitted if they are deemed to obscure the subject matter of the present invention. Since a frame size (the number of bits in a frame) is defined by a frame length and a data rate, turbo encoding/decoding or convolutional encoding/decoding is determined by the frame size.

General Overview

Figure 1:
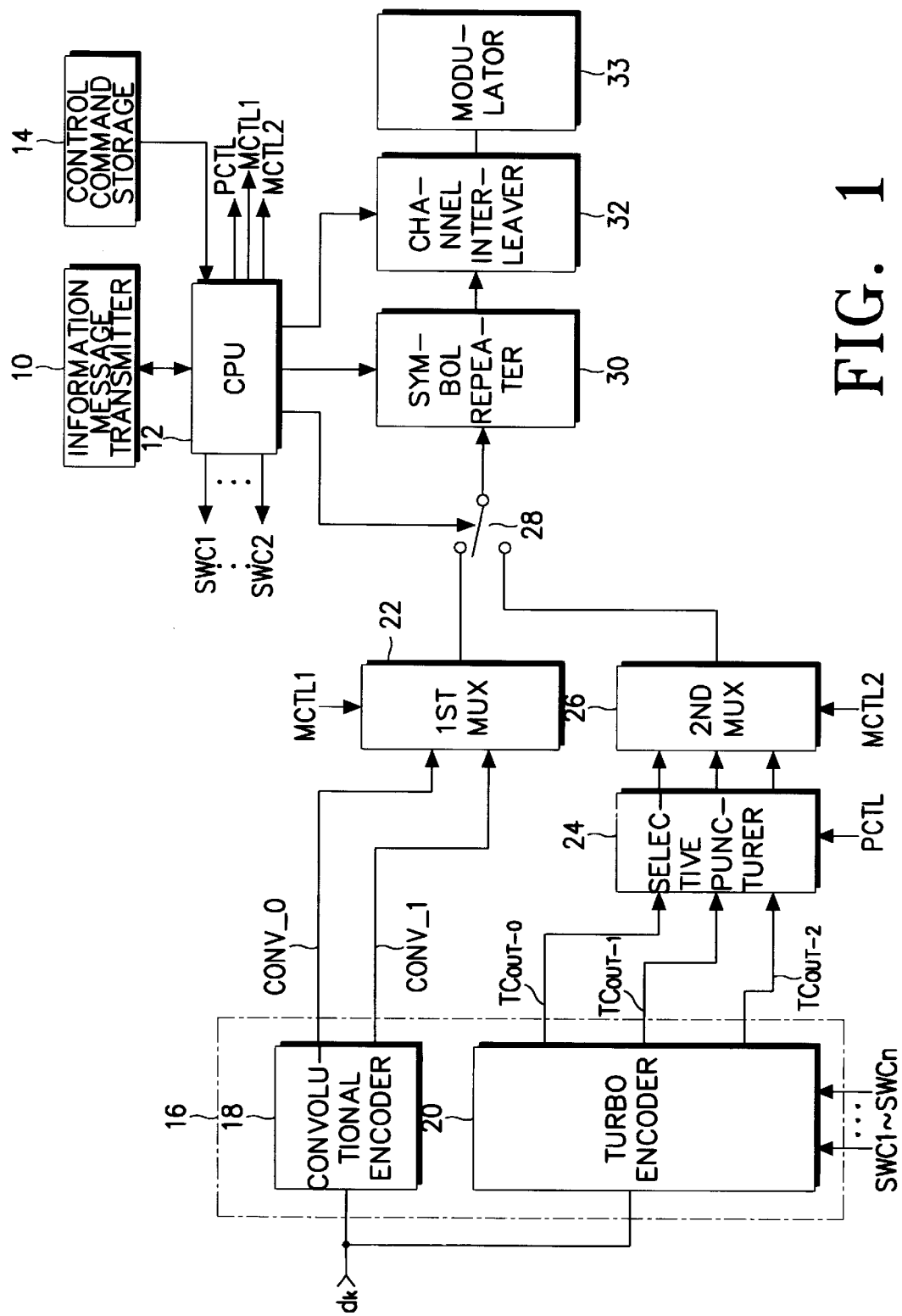
FIG. 1 is a block diagram of an adaptive channel encoding device according to a first embodiment of the present invention.

FIG. 1 is a block diagram of an adaptive channel encoding device for common use in a base station and a terminal according to a first embodiment of the present invention.

A significant characteristic of the present invention is the selection of a channel encoding method in response to the data type to be transmitted. That is the method determines whether to use a convolutional or turbo encoder responsive to the data type. Referring to FIG. 1, the adaptive channel encoding device is configured to convolutionally encode voice data or a small amount of non-voice data (e.g., 10 ms frame at or below 14.4 kbps) to be transmitted and to turbo-encode a large amount of data (e.g., 10 ms frame above 14.4 kbps).

In operation, an information message transceiver 10 transmits an information message to the receiver as part of control information representative of a service type (i.e., voice data, character data, image data, and moving picture data), and a transmission rate or a frame length which indicate said frame size, during a cell setup procedure. Then, a CPU (Control Processing Unit) 12 determines which encoder to use. In a communication environment where the data rate could be adaptively varied, data size information indicated by the information message can be transmitted on the header of a data frame or in an uncoded bit in the same manner as an existing power control bit is transmitted, as well as on the control information transmitting channel.

The CPU 12 determines which encoding scheme to choose by analyzing the received information message and a control command storage 14 to output control commands corresponding to the information message. The control commands include a coding mode depending on a service type, said frame size and switching control signals SWCi (i=0, 1, 2, . . . ) for component code generation polynomials in turbo encoding.

Specifically, the CPU 12 reads a channel encoder selection command from the control command storage 14 predetermined by the information on service type and frame size received from the information message transmitter 10. The CPU 12 sets the coding mode and control to logic high or logic low to select convolutional or turbo encoded output, and controls a symbol repeater 30 to adjust a symbol rate.

The selection of a convolutional code or a turbo code will be described in more detail below.

For input of a short data frame or a service requiring a short time delay, a switch 28 is switched to a first multiplexer 22 by setting the coding mode to logic high. Otherwise, for input of a long data frame and a data service to which a time delay is insignificant, the switch 28 is switched to a second multiplexer 26 by setting the coding mode to logic low.

In another implementation, the switch 28 may be disposed at an input terminal of an adaptive dual encoder 16 in order to selectively feed an information bit $d_k$ of an input data frame to either a convolutional encoder 18 or a turbo encoder 20 according to the coding mode set by the CPU 12.

Subsequent to setting the switch to the appropriate coding mode, the CPU 12 outputs a multiplexing control signal MCTL1 or MCTL2, and a puncture control signal PCTL based on a selected coding mode.

In a convolutional encoding mode, the convolutional encoder 18 in the adaptive dual encoder 16 encodes input frame, the information bit stream $d_k$ and feeds convolutional code symbols CONV_out_i (i=0, 1, 2, . . . ) to the first multiplexer 22. The first multiplexer 22 multiplexes the convolutional encoded symbols provided at the respective output terminals CONV_out_0 and CONV_out_1 of convolutional encoder 18 by means of the multiplexing control signal MCTL1 and applies the multiplexed code symbols to the symbol repeater 30 via switch 28 one input node of the switch 28.

In a turbo encoding mode, the turbo encoder 20 generates turbo encoded symbols TC_out_i (i=0, 1, 2, . . . ) from the information bit stream $d_k$ with corresponding generation polynomials in response to the switching control signal SWCi received from the CPU 12. Then, a selective puncturer 24 punctures, for rate matching, some of the turbo encoded symbols TC_out_0, TC_out_1, and TC_out_2 according to the puncture control signal PCTL received from the CPU 12 so as to vary the transmission rate at the output side of the turbo encoder 20. The second multiplexer 26 multiplexes the turbo code symbols TC_out_0, TC_out_1, and TC_out_2 after puncturing by the multiplexing control signal MCTL2 and applies the multiplexed code symbols to the other input node of the switch 28.

Then, the symbols output from the second multiplexer 26 via the switch 28 are repeated, interleaved, and modulated by the symbol repeater 30, a channel interleaver 32, and a modulator 33, respectively prior to transmission on a transmission channel.

Figure 2:
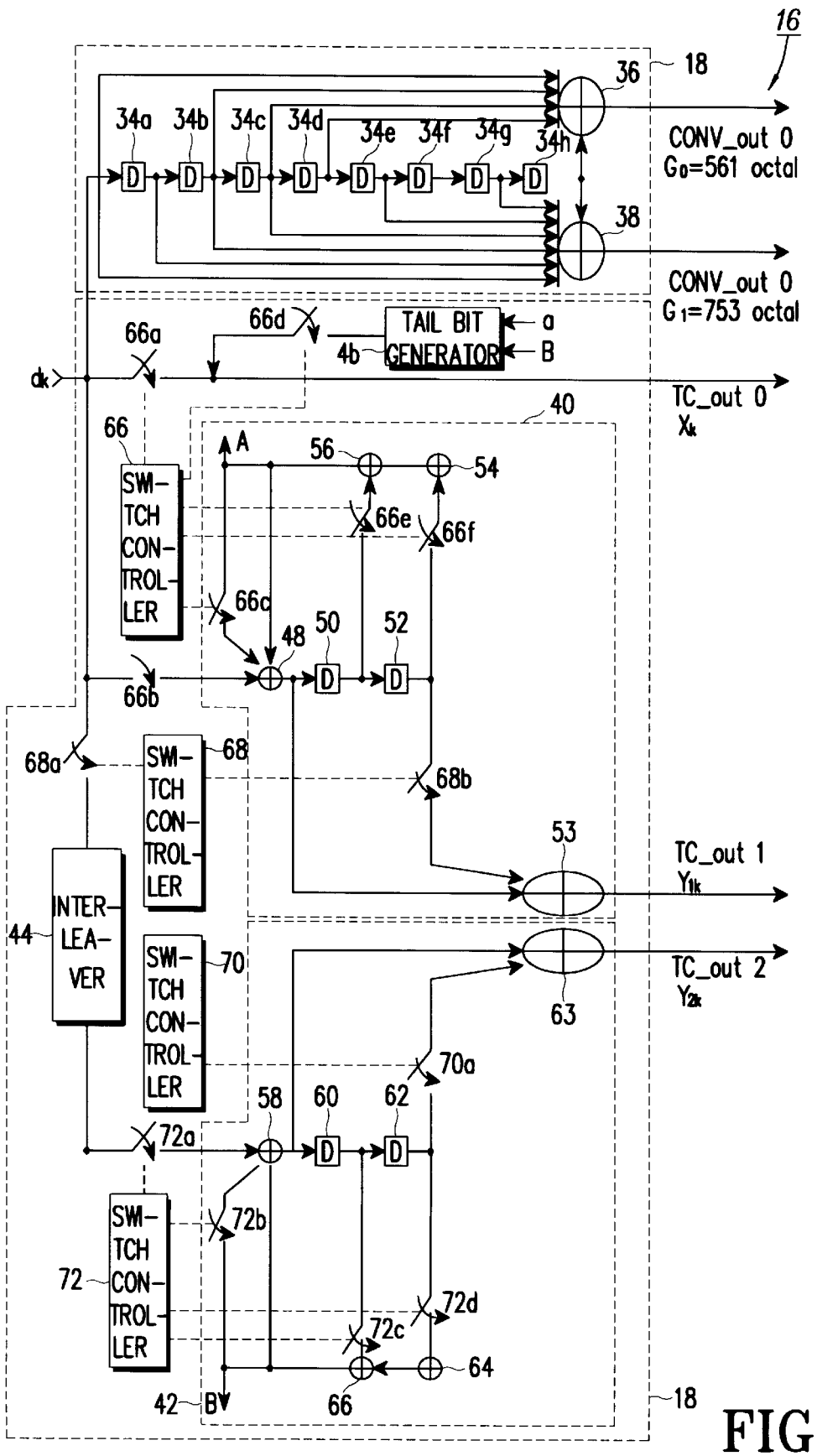
FIG. 2 is a block diagram of an adaptive dual encoder of the present invention shown in FIG. 1.

Referring now to FIGS. 1 and 2, FIG. 2 illustrates an embodiment of the adaptive dual encoder 16 of FIG. 1. For the convolutional encoder 18, generator sequences are $G_0$=561 (octal) and $G_1$=753 (octal), and for the turbo encoder 20 component codes are 7 (octal) and 5 (octal) and a code rate is 1/2 or 1/3. Due to the component codes of 7 (octal) and 5 (octal), each of component encoders 40 and 42 in the turbo encoder 20 has two memories.

Referring to FIG. 2, the convolutional encoder 18 includes eight memories 34a to 34h serially connected for delaying the input information bit $d_k$, an EX-OR gate 36 for exclusive-ORing the input information bit $d_k$ with the outputs of the memories 34b, 34c, and 34d, and an EX-OR gate 38 for exclusive-ORing the input information bit $d_k$ with the outputs of the memories 34a to 34c, 34e, and 34g.

The turbo encoder 20 has a first component encoder 40 for encoding the input information bit stream $d_k$, an interleaver 44 for interleaving the input information bit stream $d_k$, a second component encoder 42 for encoding the interleaver output, and a tail bit generator 46 for generating tail bits to terminate a frame in the first and second component encoders 40 and 42. Switches 66a, 66b, and 68a are coupled respectively between the information bit $d_k$ and the tail bit generator 46, between the information bit $d_k$ and the first component encoder 40, and between the information bit $d_k$ and the interleaver 44. A switch 72a is coupled between the interleaver 44 and the second component encoder 42. These switches 66a, 66b, 68a, and 72a are controlled by first, second, and fourth switch controllers 66, 68, and 72.

Reference numerals 66c, 66d, 66f, 68b, 70a, 72b, 72c, and 72d denote switches controlled by the first to fourth switch controllers 66 to 72, reference numerals 48, 53, 54, 56, 58, 63, 64, and 66 denote OR gates, and reference numerals 50, 52, 60, and 62 denote memories.

1. First Embodiment

A first embodiment of the adaptive dual encoder 16 of the present invention will now be described with reference to FIGS. 1 and 2. The operation of the adaptive dual encoder 16 will be described with reference to two situations; first where an information message represents voice service or data with a low data rate and a short frame and secondly where an information message represents data a high data rate or long data frame.

1a. Convolutional Encoder Operation (Used For Low Data Rate and Short Frame Data)

Referring to FIG. 1, in operation, if the information to transmit is voice service or data with a low data rate and a short frame, the CPU 12 reads a corresponding control command from the control command storage 14 to select the convolutional encoder 18 for operation, and switches the switch 28 to the first multiplexer 22.

Then, switching control signals SWC1 to SWCn are simultaneously output under control of the CPU 12 so that the switch controllers 66, 68, and 72 in the adaptive dual controller 16 turn off the switches 66a, 68a, and 72a to block all paths directed to the turbo encoder 20.

With the turbo encoder 20 disabled, the convolutional encoder 18 generate encoded parity stream of symbols CONV_out_0 and CONV_out_1 from the input information bit stream $d_k$ utilizing generator sequences 561 (octal) and 753 (octal). The parity symbols are multiplexed by the first multiplexer 22 under the control of the CPU 12 and then fed to the symbol repeater 30 through the switch 28. The symbol repeater 30 repeats the multiplexed code symbols to achieve an intended transmission rate and the output symbols of repeater are interleaved by the interleaver 32 and modulated by the modulator 33 prior to transmission on a transmission channel.

Therefore, it is shown that for an input of a voice data frame type, the channel encoding device of FIG. 1 automatically selects the convolutional encoder 18 which exhibits excellent coding performance for a frame size of around 100 to 300 bits and a BER of $10^{-3}$, thereby increasing encoding efficiency.

1b. Turbo Encoder Operation (Used For High Data Rate or Long Frame Data)

If the information to transmit is data (e.g., characters, images, and moving pictures) with a high data rate or a long data frame in a data service, the CPU 12 reads a corresponding control command from the control command storage 14, operates the turbo encoder 20, and switches the switch 28 to the second multiplexer 26.

More specifically, the CPU 12 controls the first to fourth switch controllers 66 to 72 in FIG. 2 by the switching control signals SWC1 to SWCn for generation polynomials in the first and second component encoders 40 and 42 of the turbo encoder 20.

The first to fourth switch controllers 66 to 72 control their respective switches in response to the switching control signals SWC1 to SWCn. The switch controller 66 turns on the switch 66a to generate a code symbol $X_k$ from the information bit $d_k$, turns on the switch 66b to direct the input data frame to the first component encoder 40, turns on the switches 66e and 66f, and turns off the switch 66d for inserting tail bits. The switch controller 68 turns on the switch 68a to direct the input information bit $d_k$ to the interleaver 44, and turns on the switch 68b for connecting the output of the last memory (shift register) in the first component encoder 40 to the EX-OR gate 53. The switch controller 70 turns on the switch 70a to connect the output of the last memory in the second component encoder 42 to the EX-OR gate 63. The switch controller 72 turns on the switch 72a to connect the output of the interleaver 44 to the second component encoder 42 and turns off the switch 72b for inserting tail bits.

In accordance with the operation of the first embodiment of the present invention, upon receipt of the information bit $d_k$, turbo encoding is performed by the first component encoder 40, the interleaver 44, and the second component encoder 42. Tails bits are inserted at the end of a data frame to indicate frame termination in the first and second component encoder 40 and 42. When the data frame is completely input, the first and fourth switch controllers 66 and 72 turn off the switches 66a, 66b, and 72a, and turn on the switches 66d, 66c, and 72b. While the switches 66c and 72b are on, four bits are added to the input data frame. Thus, a turbo encoder output symbol $X_k$ contains four tail bits, and each of turbo encoder output symbols $Y_{lk}$ and $Y_{sk}$ contains encoded four tails bits. Therefore, the total addition bits for tail and tail parity are eight. The next frame's input is processed like the previous frame by turning on all switches except for the switches for inserting tail bits.

As a result of turbo encoding, a code symbol TC_out_0 is output from the information bit $d_k$ without encoding, a code symbol TC_out_1 is output from the EX-OR gate 53 of the first component encoder 40, and a code symbol TC_out_2 is output from the EX-OR gate 63 of the second component encoder 42. The code symbols are fed to the selective puncturer 24.

The selective puncturer 24 punctures the code symbols by the puncture control signal PCTL received from the CPU 12 to achieve an intended transmission rate. For example, for the 1/2 data rate, the coded symbols and TC_out_1 and TC_out_1 are punctured alternatively. For the 1/3 data rate, the codeword symbols TC_out_0, TC_out_1, and TC_out_2 are not punctured. The second multiplexer 26 multiplexes the turbo code symbols at a transmission rate adjusted by the selective puncturer 24. The multiplexed symbols are repeated, interleaved, and modulated by the symbol repeater 30, the channel interleaver 32, and the modulator 33 prior to transmission on a transmission channel.

2. Second Embodiment

Figure 3:
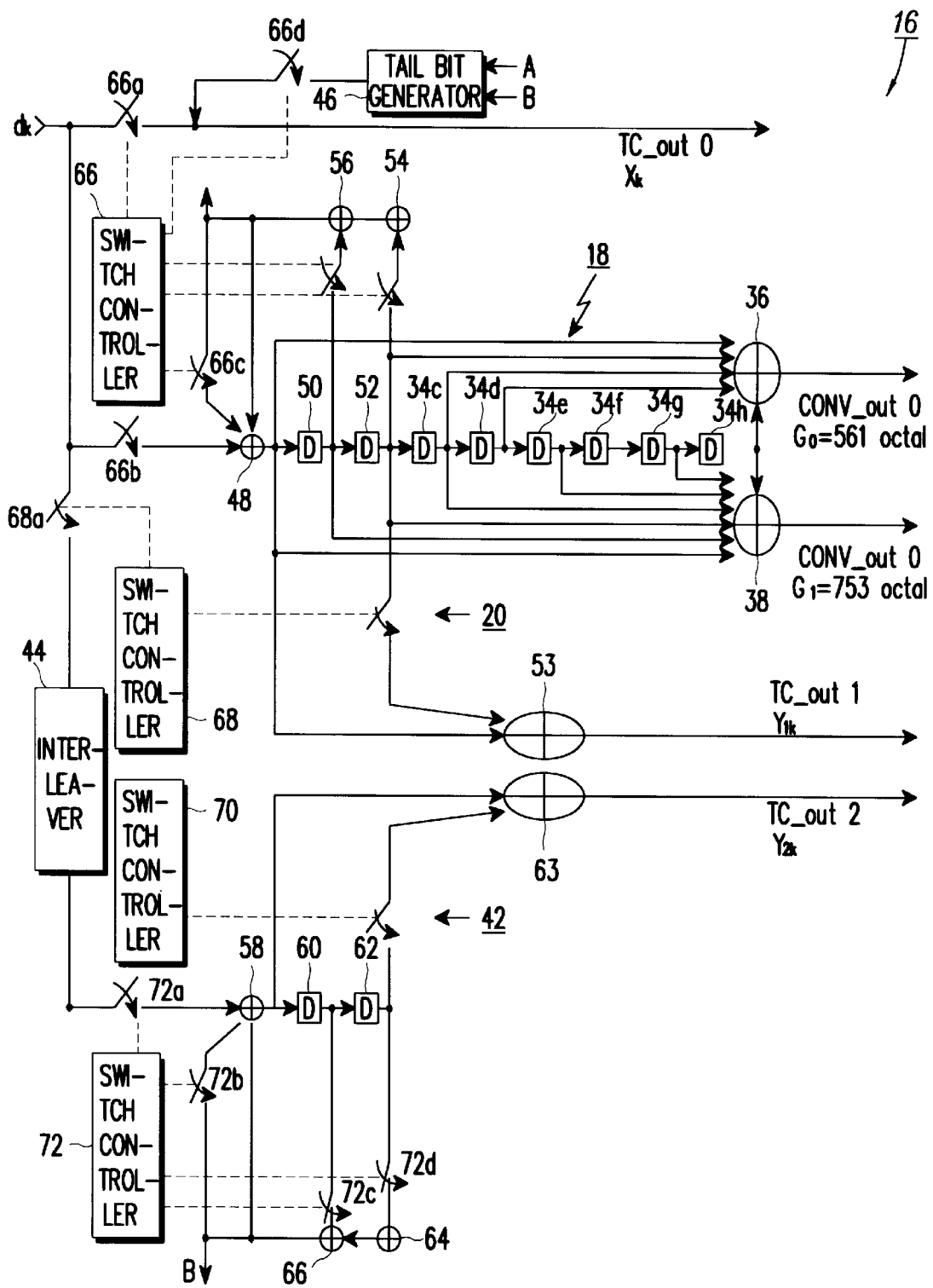
FIG. 3 is a block diagram illustrating a second embodiment of the adaptive dual encoder of the present invention shown in FIG. 1.

A second embodiment of the adaptive dual encoder 16 of the present invention, as shown in FIG. 3, operates in substantially the same way as described with respect to the previous embodiments. The basic difference between these embodiments is that in the second embodiment some memories of the convolutional encoder 18 are shared by the first component encoder 40 of the turbo encoder 20.

More specifically, upon receipt of a data frame smaller than a predetermined size, the convolutional encoder 18 is operated by tuning off the switches 66a, 66c, 66d, 66e, 66f, 68a, 68b, 70a, 72a, 72b, 72c, and 72d and turning on the switch 66b.

Upon receipt of a data frame at or above the predetermined size, the turbo encoder 20 is operated. To do this, the switch controller 66 turns on the switch 66a to generate the code symbol $X_k$ from the information bit $d_k$, turns on the switch 66b to direct the input data frame to the first component encoder 40, turns on the switches 66e and 66f, and turns off the switch 66d for inserting tail bits. The switch controller 68 turns on the switch 68a to direct the input information bit $d_k$ to the interleaver 44, and turns on the switch 68b for connecting the output of the last memory (shift register) in the first component encoder 40 to the EX-OR gate 53. The switch controller 70 turns on the switch 70a to connect the output of the last memory in the second component encoder 42 to the EX-OR gate 63. The switch controller 72 turns on the switch 72a to connect the output of the interleaver 44 to the second component encoder 42 and turns off the switch 72b for inserting tail bits.

In accordance with the operation of the second embodiment of the present invention, upon receipt of the information bit $d_k$, turbo encoding is performed by the first component encoder 40, the interleaver 44, and the second component encoder 42. Tails bits are inserted at the end of a data frame to indicate frame termination in the first and second component encoder 40 and 42. When the data frame is completely input, the first and fourth switch controllers 66 and 72 turn off the switches 66a, 66b, and 72a, and turn on the switches 66d, 66c, and 72b. While the switches 66c and 72b are on, four tails bits are added to the input data frame. Thus, the turbo encoder output symbol $X_k$ contains four tail bits, and each of the turbo encoder output symbols $Y_{lk}$ and $Y_{sk}$ contains four encoded tail bits. The next frame is input by turning on all switches except for the switches for inserting tail bits. It should be appreciated that many variations can be made to the specific generation polynomials, switch controller, switches, and insertion of tails bits for frame termination, the modifications being within the capabilities of those skilled in the art.

3. Third Embodiment

Figure 4:
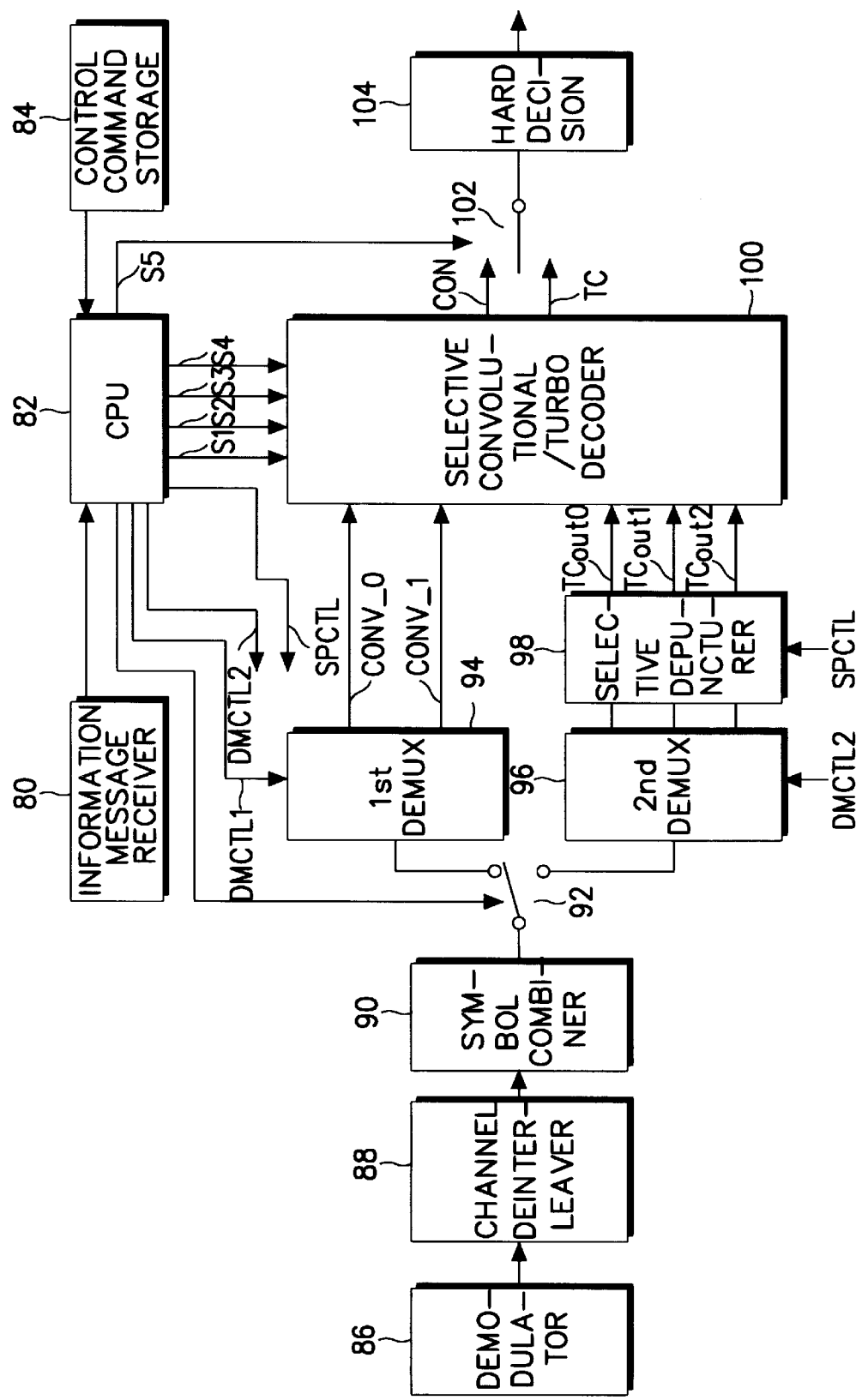
FIG. 4 is a block diagram illustrating an embodiment of an adaptive channel decoding device of the present invention.

A third embodiment of the adaptive channel decoding device of the present invention is shown in FIG. 4.

The adaptive channel decoding device includes an information message receiver 80 for receiving an information message from the information message transceiver 10 of the channel encoding device shown in FIG. 1, and a CPU 82 for analyzing the service type and transmission rate of input data based on the information message, determining which decoder to use, reading corresponding decoding mode commands from a control command storage 84, and outputting control signals. Here, the decoding mode commands include decoding mode switching control signals S1 to S5 for selecting convolutional decoding or turbo decoding in a selective convolutional/turbo decoder 100. While the information message indicates both service type and frame size in the present embodiment, it is to be noted that a decoding mode can be determined by detecting either the service type or the frame size.

The CPU 82 determines which decoding mode to choose based on the received information message. For example, if input data is to be decoded in a convolutional decoding mode, the CPU 82 connects a switch 92 to a first demultiplexer 94 and sets the decoding mode control signals S1 to S5 to the convolutional decoding mode. On the other hand, if the input data is to be decoded in a turbo decoding mode, the CPU 82 connects the switch 92 to a second demultiplexer 96 and sets the decoding mode control signals S1 to S5 to the turbo decoding mode. The first and second demultiplexers 94 and 96 operate by demultiplexing control signals DMCTL1 and DMCTL2 received from the CPU 82.

3a. Convolutional Decoding Mode

In the convolutional decoding mode, the switch 92 is connected to the first demultiplexer 94, and the selective convolutional/turbo decoder 100 is set to the convolutional decoding mode. Upon receipt of a modulated data frame, the data frame is demodulated, deinterleaved, and symbol-combined by a demodulator 86, a channel deinterleaver 88, and a symbol combiner 90 under the control of the CPU 82. The symbol combiner 90 serves to adjust a transmission rate. The first demultiplexer 94 demultiplexes the data symbols received from the symbol combiner 90 through the switch 92 into convolutional code symbols CONV_out_0 and CONV_out_1 in response to the demultiplexing control signal DMCTL1. The selective convolutional/turbo decoder 100 convolutionally decodes the convolutional encoded symbols by the decoding mode controlling signals S1 to S4. A hard-decision circuit 104 generates a final convolutionally decoded signal from the decoded signal received from the selective convolutional/turbo decoder 100 through a terminal CON and a switch 102. The operation of the selective convolutional/turbo decoder 100 selectively set to convolutional and turbo decoding by the decoding mode control signals S1 to S4 will be described later with reference to FIG. 5.

3b. Turbo Decoding Mode

In the turbo decoding mode, the switch 92 is connected to the second demultiplexer 96, and the selective convolutional/turbo decoder 100 is set to the turbo decoding mode. Upon receipt of a modulated data frame, the data frame is demodulated, deinterleaved, and symbol-combined by a demodulator 86, a channel deinterleaver 88, and a symbol combiner 90 under the control of the CPU 82. The second demultiplexer 96 demultiplexes the data symbols received from the symbol combiner 90 through the switch 92 into turbo code symbols TC_out_0, TC_out_1, and TC_out_2 in response to the demultiplexing control signal DMCTL2. A selective depuncturer 98 depunctures the code symbols by a depuncture control signal SPCTL received from the CPU 82 to adjust a transmission rate. The selective convolutional/turbo decoder 100 turbo-decodes the turbo encoded symbols after depuncturing by the decoding mode controlling signals S1 to S4. The hard-decision circuit 104 generates a final turbo-decoded signal from the decoded signal received from the selective convolutional/turbo decoder 100 through a terminal TC and the switch 102.

Accordingly, the adaptive channel decoding device of FIG. 4 can accurately decode input data symbols which are selectively convolutionally encoded or turbo-encoded in a transmitting side according to service type and transmission frame size.

Selective Convolutional/Turbo Decoder

Figure 5:
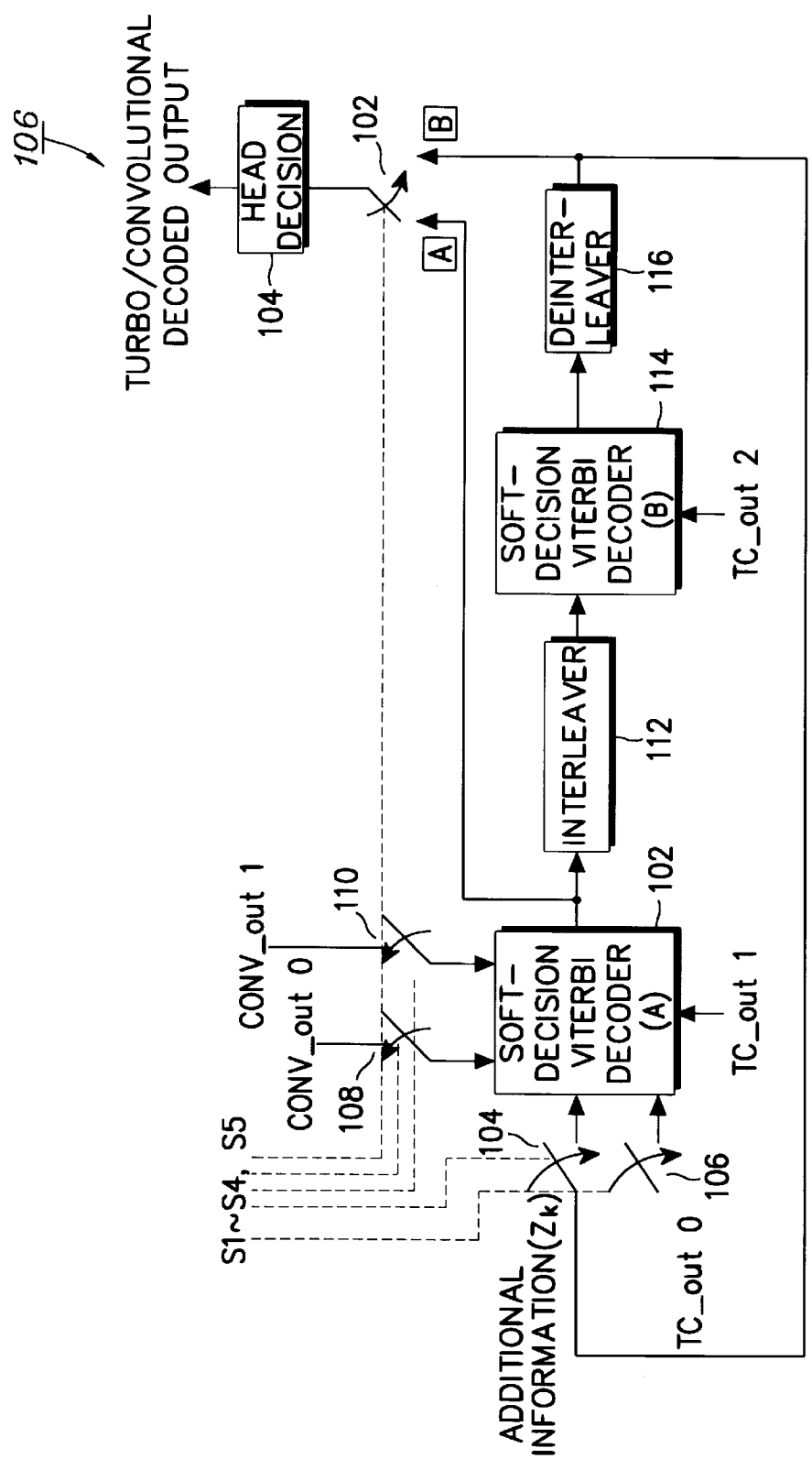
FIG. 5 is a detailed block diagram of a selective convolutional/turbo decoder shown in FIG. 4 as an adaptive dual decoder.

FIG. 5 is a detailed block diagram of the selective convolutional/turbo decoder 100 shown in FIG. 4 as an adaptive dual decoder. The selective convolutional/turbo decoder 100 is identical to a turbo decoder except for switches 108 and 110 and some additional lines to decode convolutionally encoded symbols. Here, a first soft-decision Viterbi decoder 102 is commonly used to decode both turbo encoded symbols and convolutionally encoded symbols. Hence, the convolutionally encoded symbols, that is, voice data and a small amount of general data can be decoded by controlling the first soft-decision Viterbi decoder 102. The selective convolutional/turbo decoder is comprised of the first soft-decision Viterbi decoder 102 for soft-decision decoding the convolutional code symbols CONV_out_0 and CONV_out_1, or the turbo code symbols TC_out_0 and TC_out_1 and fed-back turbo code additional information $Z_k$, an interleaver 112 for interleaving the output of the first soft-decision Viterbi decoder 102, a second soft-decision Viterbi decoder 114 for soft-decision decoding the interleaver output and the turbo codeword symbol TC_out_2, a deinterleaver 116 for deinterleaving the output of the second soft-decision Viterbi decoder 114 and feeding back the deinterleaver output to the first soft-decision Viterbi decoder 102, and switches 106 to 110 for switching input information to the first soft-decision Viterbi decoder 102

If the decoding mode control signals S1 to S5 are output in a convolutional decoding mode under the control of the CPU 82, the switches 106 and 104 are off and the switches 108 and 110 are on. The switch 102 is connected to a terminal A. Then, upon receipt of the convolutionally encoded symbols CONV_out_0 and CONV_out_1 from the first demultiplexer 94 of FIG. 4, the first soft-decision Viterbi decoder 111 convolutionally decodes the code symbols. The hard-decision circuit 104 generates a final convolutionally decoded signal from the decoded signal received from the first soft-decision Viterbi decoder 111 through the switch 102.

If the decoding mode control signals S1 to S5 are output in a turbo decoding mode under the control of the CPU 82, the switches 106 and 104 are on and the switches 108 and 110 are off. The switch 102 is connected to a terminal B. Then, upon receipt of the turbo-encoded symbols TC_out_0, TC_out_1, and TC_out_2 from the selective depuncturer 98 of FIG. 4, the first soft-decision Viterbi decoder 111 decodes the additional information $Z_k$ fed back from the deinterleaver 116 and the turbo code symbols TC_out_0 and TC_out_1. The interleaver 112 interleaves the output of the first soft-decision Viterbi decoder 111, and the second soft-decision Viterbi decoder 114 decodes the interleaver output and the turbo code symbol TC_out_2. The deinterleaver 116 deinterleaves the output of the second soft-decision Viterbi decoder 114 and outputs the deinterleaved signal to the hard-decision circuit 104 and the first soft-decision Viterbi decoder 111 due to the repeated decoding. The hard-decision circuit 104 performs a final decoding.

In summary, the channel encoding device of FIG. 1 advantageously increases encoding performance and a transmission rate by automatically selecting the convolutional encoder 18 for a low data rate (i.e., voice frame) or a short frame alternatively and selects the turbo encoder 20 for a high data rate or a long data frame. In the case of packet data, for packets smaller than a reference size of 320 bits for example, the convolutional encoder is used for packets at the reference size or larger the turbo-encoder cab be used.

While the present invention has been described in detail with reference to the specific embodiments, they are mere exemplary applications. Thus, it is to be clearly understood that many variations can be made by anyone skilled in the art within the scope and spirit of the present invention.

What is claimed is:

1. A channel encoding method in a mobile communication system, comprising the steps of:
   selecting one of a convolutional encoding scheme and turbo encoding scheme according to a service type of data to be transmitted;
   encoding the data to be transmitted utilizing said selected encoding scheme; and
   transmitting the encoded symbols on a transmission channel.

2. The channel encoding method of claim 1, wherein if the service type of data to be transmitted is a voice service, the convolutional encoding scheme is selected.

3. The channel encoding method of claim 1, wherein if the service type of data to be transmitted is a data service, the turbo encoding scheme is selected.

4. The channel encoding method of claim 3, wherein the data service is implemented at least 32 kbps.

5. The channel encoding method of claim 1, wherein if the service type is a service provided in a long data frame, the turbo encoding scheme is selected.

6. A channel encoding method in a mobile communication system, comprising the steps of:
   selecting one of a convolutional encoding scheme and a turbo encoding scheme according to a size of data to be transmitted;
   encoding the data to be transmitted utilizing said selected encoding scheme; and
   transmitting the encoded frame data on a transmission channel.

7. The channel encoding method of claim 6, wherein if the size of data to be transmitted is smaller than a predetermined size the convolutional encoding scheme is selected if the size of data to be transmitted is larger than the predetermined size, the turbo encoding scheme is selected.

8. The channel encoding method of claim 7, wherein the predetermined size is 320 bits per frame.

9. A channel encoding method in a mobile communication system, comprising the steps of:
   selecting one of a convolutional encoding scheme and turbo encoding scheme according to one of a service type of data and size of a frame to be transmitted;
   encoding the frame data to be transmitted utilizing said selected encoding scheme; and
   transmitting the encoded frame data on a transmission channel.

10. The channel encoding method of claim 9, wherein if the service type of data to be transmitted is a voice service, the convolutional encoding scheme is selected.

11. The channel encoding method of claim 9, wherein if the service type is a data service and the data contains less than 320 bits, the convolutional encoding scheme is selected.

12. The channel encoding method of claim 9, wherein if the service type is a data service and the data contains at least 320 bits per frame, the turbo-encoding scheme is selected.

13. The channel encoding method of claim 9, wherein if the service type is a service provided in a long data frame, the turbo-encoding scheme is selected.

14. A channel decoding method in a mobile communication system, comprising the steps of:
   determining a decoding scheme according to a service type of a received encoded frame data; and
   decoding the received encoded frame data in accordance with the determined decoding scheme.

15. The channel decoding method of claim 14, wherein if the service type is a voice service, the decoding scheme is determined to be a soft-decision Viterbi decoding scheme.

16. The channel decoding method of claim 14, wherein if the service type is a data service containing at least 320 bits per frame, the decoding scheme is determined to be a turbo decoding scheme.

17. The channel decoding method of claim 16, wherein the service type and frame data size associated with the encoded frame data are detected from a received information message.

18. The channel decoding method of claim 14, wherein if the service type is a service provided in a long data frame, the turbo-decoding scheme is selected.

19. A channel encoding device in a mobile communication system, comprising:
   the controller for selecting one of a convolutional encoder and a turbo encoder according to a service type of data to be transmitted;
   the convolutional encoder for convolutionally encoding the data under the control of the controller; and
   the turbo encoder for turbo-encoding the data under the control of the controller.

20. The channel encoding device of claim 19, wherein if the service type is a voice service, the convolutional encoder is selected by the controller.

21. The channel encoding device of claim 19, wherein if the service type is a data service containing at least 320 bits per frame, the turbo encoder is selected by the controller.

22. The channel encoding device of claim 19, wherein if the service type is a data service and the data contains less than 320 bits per frame, the convolutional encoder is selected by the controller.

23. The channel encoding device of claim 19, wherein if the service type is a service provided in a long data frame, the turbo encoder is selected by the controller.

24. A channel encoding device in a mobile communication system, comprising:

a controller for selecting one of a convolutional encoder and turbo encoder according to a data rate of data to be transmitted;

a convolutional encoder for encoding the input frame data under the control of the controller; and a turbo encoder for turbo-encoding the input frame data under the control of the controller.

25. The channel encoding device of claim 24, wherein if the data rate is lower than a predetermined data rate, the convolutional encoder is selected by the controller.

26. The channel encoding device of claim 24, wherein the predetermined data rate is lower than 32 kbps/10 ms.

27. The channel encoding device of claim 24, wherein if the data rate is higher than a predetermined data rate, the controller selects the turbo encoder.

28. The channel encoding device of claim 27, wherein the predetermined data rate is higher than 33 kps/10 ms.

29. A channel decoding device in a mobile communication system, comprising:

a controller for selecting one of a Viterbi decoder and a turbo decoder according to a service type of received data;

a Viterbi decoder for decoding the received data under the control of the controller; and a turbo decoder for turbo-decoding the received data under the control of the controller.

30. The channel decoding device of claim 29, wherein if the service type is a voice service, the Viterbi decoder is selected by the controller.

31. The channel decoding device of claim 29, wherein if the service type is a data service, the turbo decoder is selected by the controller.

32. The channel decoding device of claim 31, wherein if the data rate of the received data is at least 32 kps/ms, the turbo decoder is selected by the controller.

33. The channel decoding device of claim 29, wherein if the service type is a service provided in a long data frame, the turbo decoder is selected by the controller.

34. A channel decoding device in a mobile communication system, comprising:

a controller for selecting one of a Viterbi decoder and a turbo decoder according to a data rate of received data;

a Viterbi decoder for decoding the received data under the control of the controller; and a turbo decoder for turbo-decoding the received data under the control of the controller.

35. The channel decoding device of claim 34, wherein if the data rate is lower than a predetermined data rate, the Viterbi decoder is selected by the controller.

36. The channel decoding device of claim 34, wherein the predetermined data rate is lower than 32 kbps/10 ms.

37. The channel decoding device of claim 34, wherein if the data rate is higher than a predetermined data rate, the turbo encoder is selected by the controller.

38. The channel encoding device of claim 37, wherein the predetermined data rate is higher than 14.4 kbps/10 ms.

39. A channel decoding device in a mobile communication system, comprising:

a controller for selecting one of a Viterbi decoder and a turbo decoder according to a data rate of received data;

a Viterbi decoder for decoding the received data under the control of the controller; and a turbo decoder for turbo-decoding the received data under the control of the controller.

40. The channel decoding device of claim 39, wherein if the service type is a voice service, the Viterbi decoder is selected by the controller.

41. The channel decoding device of claim 39, wherein if the service type is a data service, the turbo decoder is selected by the controller.

42. The channel decoding device of claim 39, wherein if the data rate of the received data is lower than a predetermined data rate, the Viterbi decoder is selected by the controller.

43. The channel decoding device of claim 42, wherein the predetermined data rate is lower than 32 kbps/10 ms.

44. The channel decoding device of claim 39, wherein if the data rate of the received data is higher than a predetermined data rate, the turbo decoder is selected by the controller.

45. The channel decoding device of claim 44, wherein the predetermined data rate is higher than 32 kbps/10 ms.

46. The channel decoding device of claim 39, wherein if the service type is a service provided in a long data frame, the turbo decoder is selected by the controller.

* * * * *

(12) EX PARTE REEXAMINATION CERTIFICATE (8300th)
United States Patent
Park

(10) Number: US 6,166,667 C1
(45) Certificate Issued: Jun. 7, 2011

(54) SELECTION OF TURBO OR NON-TURBO ERROR CORRECTION CODES BASED ON DATA TYPE OR LENGTH

(75) Inventor: Chang-Soo Park, Seoul (KR)

(73) Assignee: Samsung Electronics Co., Ltd., Maetan-Dong, Paldal-Gu, Kyungki-Do, Suwon (KR)

Reexamination Request:
No. 90/007,189, Sep. 1, 2004

Reexamination Certificate for:
Patent No.: 6,166,667
Issued: Dec. 26, 2000
Appl. No.: 09/286,557
Filed: Apr. 5, 1999

(30) Foreign Application Priority Data

Apr. 4, 1998 (KR) .............................. 98-11997

(51) Int. Cl.
*H03M 13/00* (2006.01)

(52) U.S. Cl. .............................. 341/94; 714/755; 341/51

(58) Field of Classification Search ................. None
See application file for complete search history.

(56) References Cited

FOREIGN PATENT DOCUMENTS

EP        0820159 A2    1/1998

OTHER PUBLICATIONS

Havish Koorapaty, Yi–Pin Eric Wang, and Kumar Balachandran; "Performance of Turbo Codes with Short Frame Sizes"; pp. 329–333; 0–7603–3659–3/1997, IEEE 1997.

*Primary Examiner*—Joseph R. Pokrzywa

(57) ABSTRACT

There are provided channel encoding/decoding device and method to efficiently transmit/receive voice and data. Data with a low data rate or a short data frame is convolutionally encoded and data with a high data rate or a long data frame is turbo-encoded, thereby increasing encoding performance.

At the time of issuance and publication of this certificate, the patent remains subject to pending reissue application number 12/719,533 filed Mar. 8, 2010. The claim content of the patent may be subsequently revised if a reissue patent is issued from the reissue application.

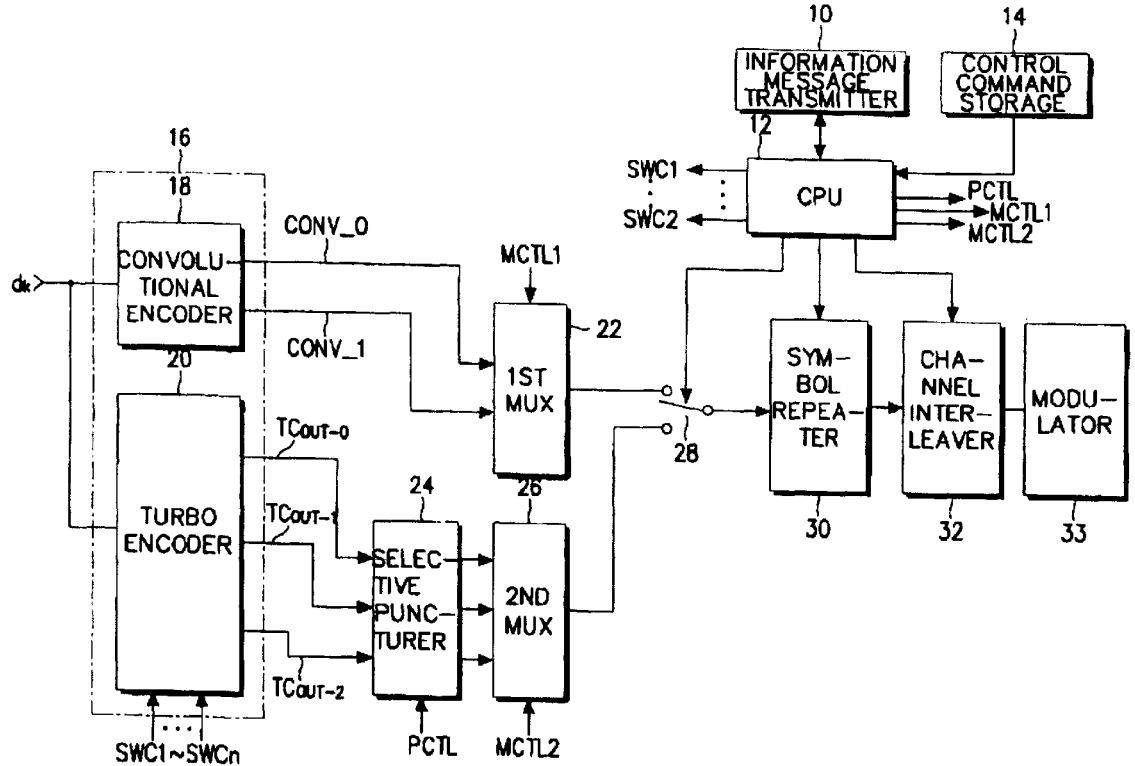

ns.

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1–18, 39 and 42–44 are cancelled.

Claims 19, 24, 26, 29, 32, 34, 36–37, 40–41 and 45–46 are determined to be patentable as amended.

Claims 20–23, 25, 27–28, 30–31, 33, 35 and 38, dependent on an amended claim, are determined to be patentable.

19. A channel encoding device in a mobile communication system, comprising:
   [the] *a* controller for selecting one of a convolutional encoder and a turbo encoder according to a service type of data to be tramsmitted;
   the convolutional encoder for convolutionally encoding the data under the control of the controller; and
   the turbo encoder for turbo-encoding the data under the control of the controller.

24. A channel encoding device in a mobile communication system, comprising:
   a controller for selecting one of a convolutional encoder and turbo encoder according to a data rate of data to be transmitted;
   [a] *the* convolutional encoder for encoding the input frame data under the control of the controller; and
   [a] *the* turbo encoder for turbo-encoding the input frame data under the control of the controller.

26. The channel encoding device of claim [24] *25*, wherein the predetermined data rate is lower than 32 kbps/10 ms.

29. A channel decoding device in a mobile communication system, comprising:
   a controller for selecting one of a Viterbi decoder and a turbo decoder according to a service type of received data;
   [a] *the* Viterbi decoder for decoding the received data under the control of the controller; and
   [a] *the* Viterbi decoder for turbo-decoding the received data under the control of the controller.

32. The channel decoding device of claim 31, wherein if the data rate of the received data is at least 32 [kps] *kbps/10* ms, the turbo decoder is selected by the controller.

34. A channel decoding device in a mobile communication system, comprising:
   a controller for selecting one of a Viterbi decoder and a turbo decoder according to a data rate of received data;
   [a] *the* Viterbi decoder for decoding the received data under the control of the controller; and
   [a] *the* turbo decoder for turbo-decoding the received data under the control of the controller.

36. The channel decoding device of claim [34] *35*, wherein the predetermined data rate is lower than 32 kbps/10 ms.

37. The channel decoding device of claim 34, wherein if the data rate is higher than a predetermined data rate, the turbo [encoder] *decoder* is selected by the controller.

40. The channel decoding device of claim [39] *34*, wherein if the service type is a voice service, the Viterbi decoder is selected by the controller.

41. The channel decoding device of claim [39] *34*, wherein if the service type is a data service, the turbo decoder is selected by the controller.

45. The channel decoding device of claim [44] *37*, wherein the predetermined data rate is higher than 32 kbps/10 ms.

46. The channel decoding device of claim [39] *34*, wherein if the service type is a service provided in a long data frame, the turbo decoder is selected by the controller.

\* \* \* \* \*